(12) United States Patent
Huang et al.

(10) Patent No.: US 10,331,253 B2
(45) Date of Patent: Jun. 25, 2019

(54) IN-CELL TOUCH SCREEN

(71) Applicant: WUHAN CHINA STAR OPTOELECTRONICS TECHNOLOGY CO., LTD., Wuhan (CN)

(72) Inventors: Yao-Li Huang, Wuhan (CN); Xinglong He, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/572,806

(22) PCT Filed: Aug. 8, 2017

(86) PCT No.: PCT/CN2017/096387
§ 371 (c)(1),
(2) Date: Nov. 9, 2017

(87) PCT Pub. No.: WO2019/000577
PCT Pub. Date: Jan. 3, 2019

(65) Prior Publication Data
US 2019/0004641 A1    Jan. 3, 2019

(51) Int. Cl.
*G06F 3/041* (2006.01)
*G06F 3/047* (2006.01)
*G02F 1/1333* (2006.01)
*G02F 1/1335* (2006.01)
*G02F 1/1343* (2006.01)

(52) U.S. Cl.
CPC .......... *G06F 3/0412* (2013.01); *G02F 1/1343* (2013.01); *G02F 1/13338* (2013.01); *G02F 1/133512* (2013.01); *G02F 1/133514* (2013.01); *G06F 3/047* (2013.01); *G02F 2201/121* (2013.01)

(58) Field of Classification Search
CPC ......... G06F 3/0412; G06F 3/044; G06F 3/047
See application file for complete search history.

(56) References Cited

U.S. PATENT DOCUMENTS

2016/0246408 A1*  8/2016  Wang ................. G06F 3/044
2016/0378254 A1*  12/2016 Wang ................. G06F 3/044
                                                          345/174

* cited by examiner

*Primary Examiner* — Hong Zhou
(74) *Attorney, Agent, or Firm* — JMB Davis Ben-David

(57) ABSTRACT

An in-cell touch screen is provided and has an array substrate, where a metal is added into and disposed in a gap between common electrode plates of the array substrate. The metal is connected with the common electrode plates, and the metal together with pixel electrodes form an electric field, such that liquid crystal molecules in an area corresponding to the gap between the common electrode plates are driven to tilt normally. Therefore, the area and other display areas have an identical display effect.

15 Claims, 2 Drawing Sheets

IN-CELL TOUCH SCREEN

CROSS-REFERENCE TO RELATED APPLICATIONS

This is the U.S. National Stage of International Patent Application No. PCT/CN2017/0964387, filed Aug. 8, 2017, which in turn claims the benefit of Chinese Patent Application No. 201710523600.X, filed Jun. 30, 2017.

FIELD OF THE DISCLOSURE

The present disclosure relates to the technical field of liquid crystal displays, and more particularly to an in-cell touch screen.

BACKGROUND OF THE DISCLOSURE

Touch screens are used as a kind of input medium, which are a simple, convenient, and a natural way of human-computer interaction. Liquid crystals are increasingly used in display panels due to good electrical controllability. Therefore, touch screens are usually integrated in liquid crystal display panels so as to form a variety of electronic products, such as mobile phones, laptops, MP3/MP4, and so on.

A conventional in-cell touch screen achieves a touch sensing by sharing a common electrode with a display. FIG. 1 is a structural schematic diagram of the conventional in-cell touch screen including a color filter substrate and an array substrate. The color filter substrate includes a first glass substrate 101, a color resist layer 102, and a black matrix 103. The array substrate includes a second glass substrate 104, a buffer layer 105, a gate insulating layer 106, an interlayer insulating layer 107, a planarization layer 108, a common electrode layer, a dielectric layer 109, sensing electrode wires 110, a passivation layer 111, and a pixel electrode 114, all of which are stacked in sequence. The sensing electrode wires are connected with the common electrode layer through vias 112. The common electrode layer is patterned to form a number of electrode plates 113. A gap between the electrode plates 113 is formed and located directly below the black matrix 103. No electrode layer is between the electrode plates 113, and accordingly, no electrical field is in an area corresponding to the gap between the neighboring electrode plates. Therefore, a rotational direction of the liquid crystals at a location with no electrical field is inconsistent with a rotational direction of the liquid crystals in other places thereby inducing display brightness in the location with no electrical field to be inconsistent with display brightness in other places, and a display problem appears. Although the location with no electrical field is shielded by the black matrix 103, a display difference can still be viewed at a large oblique angle. Specifically, a bright line pattern or a dark line pattern is shown specifically, and a display effect is affected.

Further, horizontal light shielding strips in the black matrix 103 are used to shield thin film transistors and scan lines, where width of the horizontal light shielding strips is greater than width of vertical light shielding strips used to shield data lines. Therefore, the display problem of the bright line pattern or the dark line pattern appearing is mainly shown in an area corresponding to the vertical light shielding strips.

As mentioned above, since the conventional in-cell touch screen has no common electrode in a shielding area of the array substrate corresponding to the black matrix 103 so that liquid crystal molecules corresponding to the shielding area are flipped abnormally, the brightness in the shielding area is different from brightness in other areas. Therefore, the bright line pattern or the dark line pattern appears in the liquid crystal display panels when viewed from a large viewing angle, and a viewing effect is affected.

SUMMARY OF THE DISCLOSURE

The present disclosure provides an in-cell touch screen which enables liquid crystal molecules corresponding to a shielding area of a black matrix to rotate normally so as to have a normal display effect in the area. Therefore, the technical problems that, since the conventional in-cell touch screen has no common electrode in a shielding area of the array substrate corresponding to the black matrix so that liquid crystal molecules corresponding to the shielding area are flipped abnormally and brightness in the shielding area is different from brightness in other areas, such that the liquid crystal display panels, when viewed from a large viewing angle, have the bright line pattern or the dark line pattern appear and a viewing effect is affected, can be solved.

In order to solve the above problems, a technical solution of the present disclosure is provided as follows:

The present disclosure provides an in-cell touch screen including:

a color filter substrate comprising a color resist layer and a black matrix, wherein the black matrix comprises a plurality of horizontal light shielding strips configured to shield scan lines and a plurality of vertical light shielding strips configured to shield data lines; and an array substrate disposed and facing the color filter substrate, wherein the array substrate comprises:

a substrate;

a buffer layer disposed on a surface of the substrate;

a gate insulating layer disposed on a surface of the buffer layer; a first interlayer insulating layer disposed on a surface of the gate insulating layer;

a planarization layer disposed on a surface of the first interlayer insulating layer;

a common electrode layer disposed on a surface of the planarization layer, wherein a patterning process is performed on the common electrode layer to form a number of common electrode plates distributed in an array; wherein horizontal gaps and vertical gaps are formed between the neighboring common electrode plates, wherein the horizontal gaps are shielded by the horizontal light shielding strips, and the vertical gaps are shielded by the vertical light shielding strips;

a second interlayer insulating layer disposed on a surface of the common electrode layer, wherein a plurality of first metal vias and a plurality of second metal vias are formed in the second interlayer insulating layer, and the second metal vias are formed and closely fitting to edges of the common electrode plates;

a plurality of sensing electrode wires distributed on a surface of the second interlayer insulating layer, wherein the sensing electrode wires are parallel to each other and are connected with the common electrode plates through the first metal vias; and a plurality of sensing electrode sub-wires distributed on the surface of the second interlayer insulating layer and connected with the common electrode plates through the second metal vias, wherein the sensing electrode sub-wires and the sensing electrode wires are parallel to each other, and one of the sensing electrode sub-wires is located between one of the vertical light shielding strips and the corresponding vertical gap.

According to a preferred embodiment of the present disclosure, a passivation layer is disposed on a surface of the second interlayer insulating layer, a number of pixel electrodes distributed in an array are disposed on a surface of the passivation layer, and the sensing electrode sub-wires together with the pixel electrodes form an electric field configured to drive liquid crystal molecules to tilt.

According to a preferred embodiment of the present disclosure, one of the sensing electrode sub-wires is correspondingly disposed in the vertical gap between the common electrode plates in two neighboring columns, and the sensing electrode sub-wire is connected with one of the common electrode plates in the two columns.

According to a preferred embodiment of the present disclosure, the vertical gap between the common electrode plates in two neighboring columns corresponds to the plurality of sensing electrode sub-wires distributed vertically and spaced apart from each other, an interval distance between the two neighboring sensing electrode sub-wires is identical to a width of the horizontal gap, and one of the sensing electrode sub-wires is connected with one of the common electrode plates located on a side of the sensing electrode sub-wire.

According to a preferred embodiment of the present disclosure, each of the second metal vias has an aperture less than an aperture of each of the first metal vias.

The present disclosure provides an in-cell touch screen including:
a color filter substrate comprising a color resist layer and a black matrix, wherein the black matrix comprises a plurality of horizontal light shielding strips configured to shield scan lines and a plurality of vertical light shielding strips configured to shield data lines; and
an array substrate disposed and facing the color filter substrate, wherein the array substrate comprises:
  a substrate;
  a buffer layer disposed on a surface of the substrate;
  a gate insulating layer disposed on a surface of the buffer layer;
  a first interlayer insulating layer disposed on a surface of the gate insulating;
  a planarization layer disposed on a surface of the first interlayer insulating layer;
  a common electrode layer disposed on a surface of the planarization layer, wherein a patterning process is performed on the common electrode layer to form a number of common electrode plates distributed in an array; wherein horizontal gaps and vertical gaps are formed between the neighboring common electrode plates, wherein the horizontal gaps are shielded by the horizontal light shielding strips, and the vertical gaps are shielded by the vertical light shielding strips;
  a second interlayer insulating layer disposed on a surface of the common electrode layer, wherein a plurality of first metal vias and a plurality of second metal vias are formed in the second interlayer insulating layer;
  a plurality of sensing electrode wires distributed on a surface of the second interlayer insulating layer, wherein the sensing electrode wires are parallel to each other and are connected with the common electrode plates through the first metal vias; and
  a plurality of sensing electrode sub-wires distributed on the surface of the second interlayer insulating layer and connected with the common electrode plates through the second metal vias, wherein the sensing electrode sub-wires and the sensing electrode wires are parallel to each other, and one of the sensing electrode sub-wires is located between one of the vertical light shielding strips and the corresponding vertical gap.

According to a preferred embodiment of the present disclosure, a passivation layer is disposed on a surface of the second interlayer insulating layer, a number of pixel electrodes distributed in an array are disposed on a surface of the passivation layer, and the sensing electrode sub-wires together with the pixel electrodes form an electric field configured to drive liquid crystal molecules to tilt.

According to a preferred embodiment of the present disclosure, one of the sensing electrode sub-wires is correspondingly disposed in the vertical gap between the common electrode plates in two neighboring columns, and the sensing electrode sub-wire is connected with one of the common electrode plates in the two columns.

According to a preferred embodiment of the present disclosure, the vertical gap between the common electrode plates in two neighboring columns corresponds to the plurality of sensing electrode sub-wires distributed vertically and spaced apart from each other, an interval distance between the two neighboring sensing electrode sub-wires is identical to a width of the horizontal gap, and one of the sensing electrode sub-wires is connected with one of the common electrode plates located on a side of the sensing electrode sub-wire.

According to a preferred embodiment of the present disclosure, each of the second metal vias has an aperture less than an aperture of each of the first metal vias.

According to the above purpose of the present disclosure, an in-cell touch screen is further provided, including:
a color filter substrate comprising a color resist layer and a black matrix, wherein the black matrix comprises a plurality of horizontal light shielding strips configured to shield scan lines and a plurality of vertical light shielding strips configured to shield data lines; and
an array substrate disposed and facing the color filter substrate, wherein the array substrate comprises:
  a substrate;
  a buffer layer disposed on a surface of the substrate;
  a gate insulating layer disposed on a surface of the buffer layer;
  a first interlayer insulating layer disposed on a surface of the gate insulating;
  a planarization layer disposed on a surface of the first interlayer insulating layer;
  a common electrode layer disposed on a surface of the planarization layer, wherein a patterning process is performed on the common electrode layer to form a number of common electrode plates distributed in an array; wherein horizontal gaps and vertical gaps are formed between the neighboring common electrode plates, wherein the horizontal gaps are shielded by the horizontal light shielding strips, and the vertical gaps are shielded by the vertical light shielding strips;
  a second interlayer insulating layer disposed on a surface of the common electrode layer, wherein a plurality of first metal vias are formed in the second interlayer insulating layer;
  a plurality of sensing electrode wires distributed on a surface of the second interlayer insulating layer, wherein the sensing electrode wires are parallel to each other and are connected with the common electrode plates through the first metal vias;
  a passivation layer disposed on the surface of the second interlayer insulating layer, wherein a number of second metal vias pass through the passivation layer and the second interlayer insulating layer;

a transparent electrode layer disposed on a surface of the passivation layer, wherein a patterning process is performed on the transparent electrode layer to form a number of pixel electrodes in an array, and a gap is between two neighboring pixel electrodes; and a plurality of pixel sub-electrodes distributed on the surface of the passivation layer and connected with the common electrode plates through the second metal vias, wherein one of the pixel sub-electrodes is located between one of the vertical light shielding strips and the corresponding vertical gap.

According to a preferred embodiment of the present disclosure, the pixel sub-electrode is located between the two neighboring pixel electrodes, and the pixel sub-electrode together with the pixel electrodes located at two sides of the pixel sub-electrode form an electric field configured to drive liquid crystal molecules to tilt.

According to a preferred embodiment of the present disclosure, the pixel sub-electrode in a column is correspondingly disposed in the vertical gap between the common electrode plates in two neighboring columns, and the pixel sub-electrode is connected with one of the common electrode plates in the two columns.

According to a preferred embodiment of the present disclosure, in the pixel sub-electrodes are located in a same column, an interval distance between the two neighboring pixel sub-electrodes is identical to a width of the horizontal gap.

According to a preferred embodiment of the present disclosure, each of the second metal vias has an aperture less than an aperture of each of the first metal vias.

The beneficial effects of the present disclosure are that: in comparison with a conventional in-cell touch screen, an in-cell touch screen provided by the present disclosure which enables liquid crystal molecules corresponding to a shielding area of a black matrix to rotate normally by disposing a metal on a shielding position of the black matrix, so as to have a normal display effect in the area. Therefore, the technical problems that, since the conventional in-cell touch screen has no common electrode in a shielding area of the array substrate corresponding to the black matrix so that liquid crystal molecules corresponding to the shielding area are flipped abnormally and brightness in the shielding area is different from the brightness in other areas, such that the liquid crystal display panels, when viewed from a large viewing angle, have bright line patterns or dark line patterns appear and a viewing effect is affected, can be solved.

DESCRIPTION OF THE DRAWINGS

In order to more clearly describe embodiments of the present disclosure or technical solutions in a conventional technology, drawings required to be used for the embodiments or descriptions of the conventional technology are simply described hereinafter. Apparently, the drawings described below only illustrate some embodiments of the present disclosure. Those skilled in the art can obtain other drawings based on these drawings disclosed herein without creative effort.

DETAILED DESCRIPTION OF THE PREFERRED EMBODIMENTS

Figure 1:
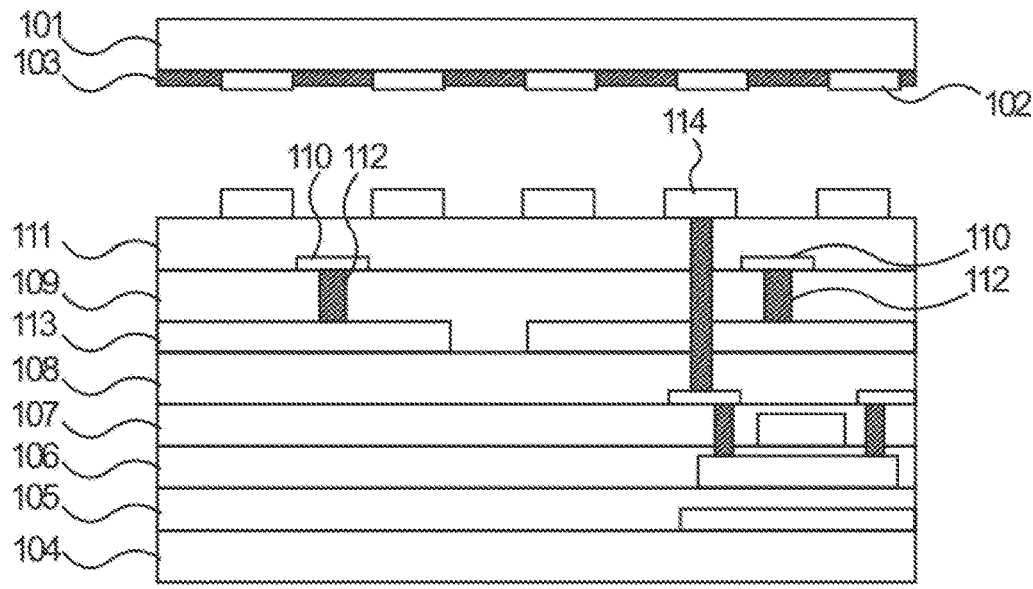
FIG. 1 is a structural diagram of a film layer of a conventional in-cell touch screen.

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc., are only directions by referring to the accompanying drawings. Thus, the used directional terms are used to describe and understand the present disclosure, but the present disclosure is not limited thereto. In the figures, elements with similar structures are indicated by the same numbers.

The present disclosure is focused on the technical problems that, since the conventional in-cell touch screen has no common electrode in a shielding area of the array substrate corresponding to the black matrix so that liquid crystal molecules corresponding to the shielding area are flipped abnormally and brightness in the shielding area is different from brightness in other areas, such that liquid crystal display panels, when viewed from a large viewing angle, have bright line patterns or dark line patterns appear and a viewing effect is affected. The present embodiments can solve the defects.

An in-cell touch screen provided by the present disclosure includes: a color filter substrate, an array substrate disposed and facing the color filter substrate, and a liquid crystal layer located between the color filter substrate and the array substrate.

The color filter substrate includes a color resist layer and a black matrix. The black matrix comprises a plurality of horizontal light shielding strips configured to shield scan lines and a plurality of vertical light shielding strips configured to shield data lines.

The array substrate includes: a substrate, a buffer layer, a gate insulating layer, a first interlayer insulating layer, a planarization layer, a common electrode layer, a second interlayer insulating layer, and a plurality of sensing electrode wires. A patterning process is performed on the common electrode layer to form a number of common electrode plates distributed in an array. Horizontal gaps and vertical gaps are formed between the neighboring common electrode plates. The horizontal gaps are shielded by the horizontal light shielding strips, and the vertical gaps are shielded by the vertical light shielding strips.

The array substrate further includes: a plurality of sensing electrode sub-wires or a plurality of pixel sub-electrodes. One of the sensing electrode sub-wires or one of the pixel sub-electrodes is located between one of the vertical light shielding strips and the corresponding vertical gap. The sensing electrode sub-wires or the pixel sub-electrodes are connected with the common electrode plates through metal vias. The sensing electrode sub-wires together with pixel electrodes or the pixel sub-electrodes together with the pixel electrodes form an electric field so as to drive liquid crystal molecules in an area corresponding to the vertical light shielding strips to tilt normally, such that the area and other display areas have an identical display effect.

Embodiment 1

Figure 2:
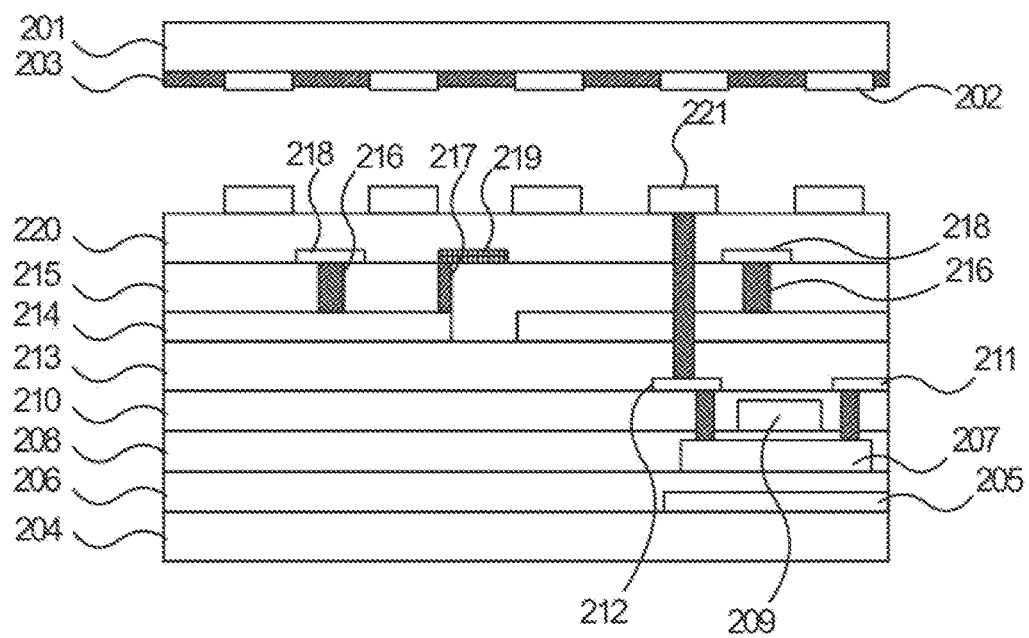
FIG. 2 is a structural diagram of a film layer of an in-cell touch screen of Embodiment 1 of the present disclosure.

As shown in FIG. 2, an embodiment of the present disclosure provides an in-cell touch screen including: a color filter substrate including: a first glass substrate 201, a color resist layer 202, and a black matrix 203, wherein the black matrix 203 includes a plurality of horizontal light shielding strips configured to shield scan lines and a plurality of vertical light shielding strips configured to shield data lines; and an array substrate disposed and facing the color filter substrate, wherein the array substrate includes a film layer structure as follows:

a second glass substrate 204;

a metal light shielding layer 205 having thin film transistors and disposed on a surface of the second glass substrate 204;

a buffer layer 206 disposed on the surface of the second glass substrate 204;

an active layer 207 having thin film transistors and disposed on a surface of the buffer layer 206, wherein the active layer 207 includes a channel, a source electrode ion-doped region located at one side of the channel, and a drain electrode ion-doped region located at another side of the channel;

a gate insulating layer 208 disposed on the surface of the buffer layer 206;

a gate electrode 209 having thin film transistor and disposed on a surface of the gate insulating layer 208;

a gate wire disposed on the surface of the gate insulating layer 208 and connected with the gate electrode 209;

a first interlayer insulating layer 210 disposed on the surface of the gate insulating layer 208;

a source electrode metal wire 211 and a drain electrode metal wire 212 disposed on a surface of the first interlayer insulating layer 210, wherein the source electrode metal wire 211 is connected with the source electrode ion-doped region through a via, and the drain electrode metal wire 212 is connected with the drain electrode ion-doped region through another via;

a planarization layer 213 disposed on the surface of the first interlayer insulating layer 210;

a common electrode layer disposed on a surface of the planarization layer 213, wherein a patterning process is performed on the common electrode layer to form a number of common electrode plates 214 distributed in an array, wherein horizontal gaps and vertical gaps are formed between the neighboring common electrode plates 214, wherein the horizontal gaps are shielded by the horizontal light shielding strips, and the vertical gaps are shielded by the vertical light shielding strips;

a second interlayer insulating layer 215 disposed on a surface of the common electrode layer, wherein a plurality of first metal vias 216 and a plurality of second metal vias 217 are formed in the second interlayer insulating layer 215;

a plurality of sensing electrode wires 218 distributed on a surface of the second interlayer insulating layer 215, wherein the sensing electrode wires 218 are parallel to each other, and one of the sensing electrode wires 218 is connected with one of the common electrode plates 214 through one of the first metal via 216; and a plurality of sensing electrode sub-wires 219 distributed on the surface of the second interlayer insulating layer 215 and connected with the common electrode plates 214 through the second metal vias 217, wherein the sensing electrode sub-wires 219 and the sensing electrode wires 218 are parallel to each other, and one of the sensing electrode sub-wires 219 is located between one of the vertical light shielding strips and the corresponding vertical gap. The second metal vias 217 are formed and closely fitting to edges of the common electrode plates 214, so as to decrease width of the sensing electrode sub-wires 219 for ensuring a pixel aperture ratio.

The sensing electrode sub-wires 219 are made of a same material as the sensing electrode wires 218, and the sensing electrode sub-wires 219 and the sensing electrode wires 218 are formed using a same mask.

A width of the sensing electrode sub-wires 219 is greater than a width of the vertical gaps so as to enable the sensing electrode sub-wires 219 to cover the vertical gaps and reserve a part of the width for connecting with the common electrode plates 214.

A passivation layer 220 is disposed on the surface of the second interlayer insulating layer 215, and a number of pixel electrodes 221 in an array are disposed on a surface of the passivation layer 220.

Electric current is provided for the sensing electrode sub-wires 219 by the common electrode plates 214 being connected with the sensing electrode sub-wires 219. An electric field is formed by the sensing electrode sub-wires 219 and the pixel electrodes 221 close thereto, so as to drive the liquid crystal molecules, which correspond to a gap between the two common electrode plates 214 disposed horizontally, to have a consistency for a rotational angle with liquid crystal molecules in other areas, so as to eliminate poor display in which bright line patterns and dark line patterns appear in a liquid crystal display when viewed from a large viewing angle.

In order to ensure an open area of pixels as much as possible, the second metal via 217 has an aperture less than an aperture of the first metal via 216, so as to minimize the width of the sensing electrode sub-wires 219 for ensuring the opening area of the pixels.

One of the sensing electrode sub-wires 219 can be correspondingly disposed in the vertical gap between the common electrode plates 214 in two neighboring columns, and the sensing electrode sub-wire 219 is connected with one of the common electrode plates 214 in the two columns. As for the sensing electrode sub-wire 219 formed using the above structure, a mask designing structure is relatively simple in a fabricating process to form the sensing electrode sub-wire 219 corresponding to one of the vertical gaps. A mask corresponding position is merely required to design a slit, and only one second metal via 217 for connecting with the common electrode plate 214 is required, so as to require a relatively low mask accuracy and the yield is improved.

As another example, the vertical gap between the common electrode plates 214 in two neighboring columns can correspond to the plurality of sensing electrode sub-wires distributed vertically and spaced apart from each other, an interval distance between the two neighboring sensing electrode sub-wires 219 is identical to a width of the horizontal gap, and one of the sensing electrode sub-wires 219 is connected with one of the common electrode plates 214 located on a side of the sensing electrode sub-wire 219. As for the sensing electrode sub-wires 219 formed using the above structure, the plurality of sensing electrode sub-wires 219 are correspondingly disposed in one of the vertical gaps. Each of the sensing electrode sub-wires 219 is connected with one of the common electrode plates 214. Electric circuit inputted into each of the sensing electrode sub-wires 219 is relatively stable. Therefore, an unstable electric circuit of the sensing electrode sub-wires 219, induced by an enlarged resistance due to the relatively long sensing electrode sub-wires 219, is avoided. Further, the plurality of sensing electrode sub-wires 219 are independent from each other. When a portion of the common electrode plates is damaged, other sensing electrode sub-wires 219 corresponding to a same vertical gap will not be affected and are used normally.

Embodiment 2

Figure 3:
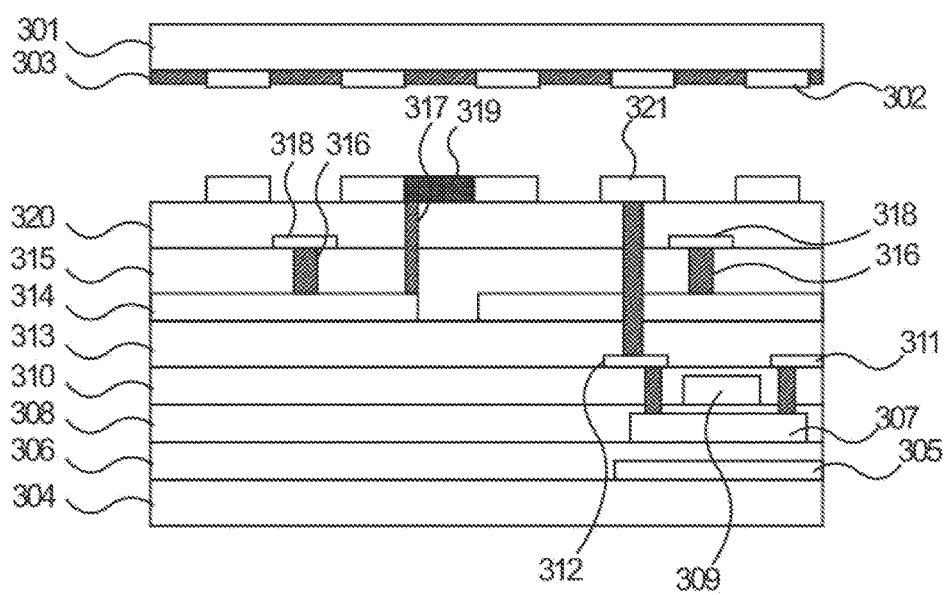
FIG. 3 is a structural diagram of a film layer of an in-cell touch screen of Embodiment 2 of the present disclosure.

As shown in FIG. 3, another embodiment of the present disclosure provides an in-cell touch screen including: a color filter substrate including: a first glass substrate 301, a color resist layer 302, and a black matrix 303, wherein the black matrix 303 includes a plurality of horizontal light shielding strips configured to shield scan lines and a plurality of vertical light shielding strips configured to shield data lines; and an array substrate disposed and facing the color filter substrate, wherein the array substrate includes a film layer structure as follows:

- a second glass substrate 304;
- a metal light shielding layer 305 having thin film transistors and disposed on a surface of the second glass substrate 304;
- a buffer layer 306 disposed on the surface of the second glass substrate 304;
- an active layer 307 having thin film transistors and disposed on a surface of the buffer layer 306, wherein the active layer 307 includes a channel, a source electrode ion-doped region located at one side of the channel, and a drain electrode ion-doped region located at another side of the channel;
- a gate insulating layer 308 disposed on the surface of the buffer layer 306;
- a gate electrode 309 having thin film transistors and disposed on a surface of the gate insulating layer 308;
- a gate wire disposed on the surface of the gate insulating layer 308 and connected with the gate electrode 309;
- a first interlayer insulating layer 310 disposed on the surface of the gate insulating layer 308;
- a source electrode metal wire 311 and a drain electrode metal wire 312 disposed on a surface of the first interlayer insulating layer 310, wherein the source electrode metal wire 311 is connected with the source electrode ion-doped region through a metal via, and the drain electrode metal wire 312 is connected with the drain electrode ion-doped region through another metal via;
- a planarization layer 313 disposed on the surface of the first interlayer insulating layer 310;
- a common electrode layer disposed on a surface of the planarization layer 313, wherein a patterning process is performed on the common electrode layer to form a number of common electrode plates 314 distributed in an array, wherein horizontal gaps and vertical gaps are formed between the neighboring common electrode plates 314, wherein the horizontal gaps are shielded by the horizontal light shielding strips, and the vertical gaps are shielded by the vertical light shielding strips;
- a second interlayer insulating layer 315 disposed on a surface of the common electrode layer, wherein a plurality of first metal vias 316 are formed in the second interlayer insulating layer 315;
- a plurality of sensing electrode wires 318 distributed on a surface of the second interlayer insulating layer 315, wherein the sensing electrode wires 318 are parallel to each other, and one of the sensing electrode wires 318 is connected with one of the common electrode plates 314 through one of the first metal via 316;
- a passivation layer 320 is disposed on the surface of the second interlayer insulating layer 315, wherein a number of second metal vias 317 pass through the passivation layer 320 and the second interlayer insulating layer 315; and
- a transparent electrode layer disposed on a surface of the passivation layer 320, wherein a patterning process is performed on the transparent electrode layer to form a number of pixel electrodes 321 in an array, and a gap is between the two neighboring pixel electrodes 321.

The array substrate further includes: a plurality of pixel sub-electrodes 319 distributed on the surface of the passivation layer 320 and connected with the common electrode plates 314 through the second metal vias 317, wherein one of the pixel sub-electrodes 319 is located between one of the vertical light shielding strips and the corresponding vertical gap.

Electric current is provided for the pixel sub-electrodes 319 by the common electrode. An electric field is formed by the pixel sub-electrodes 319 and the pixel electrodes 321 close thereto, so as to drive the liquid crystal molecules, which correspond to a gap between the two common electrode plates 314 disposed horizontally, to have a consistency for a rotational angle with liquid crystal molecules in other areas, so as to eliminate poor display in which bright line patterns and dark line patterns appear in a liquid crystal display panel when viewed from a large viewing angle.

A working principle of the touch screen of the Embodiment 2 is similar to a working principle of the touch screen of the Embodiment 1. Specifically, reference can be made to the working principle of the Embodiment 1, and will not be described here again.

The beneficial effects of the present disclosure are that: in comparison with a conventional in-cell touch screen, an in-cell touch screen provided by the present disclosure which enables liquid crystal molecules corresponding to a shielding area of a black matrix to rotate normally by disposing a metal on a shielding position of the black matrix, so as to have a normal display effect in the area. Therefore, the technical problems that, since the conventional in-cell touch screen has no common electrode in a shielding area of the array substrate corresponding to the black matrix so that liquid crystal molecules corresponding to the shielding area are flipped abnormally and brightness in the shielding area is different from brightness in other areas, such that the liquid crystal display panels, when viewed from a large viewing angle, have bright line patterns or dark line patterns appear and a viewing effect is affected, can be solved.

As described above, although the present disclosure has been described in preferred embodiments, they are not intended to limit the disclosure. One of ordinary skill in the art, without departing from the spirit and scope of the disclosure within, can make various modifications and variations, so the range of the scope of the disclosure is defined by the claims.

The invention claimed is:

1. An in-cell touch screen, comprising:
a color filter substrate comprising a color resist layer and a black matrix, wherein the black matrix comprises a plurality of horizontal light shielding strips configured to shield scan lines and a plurality of vertical light shielding strips configured to shield data lines; and
an array substrate disposed and facing the color filter substrate, wherein the array substrate comprises:
a substrate;
a buffer layer disposed on a surface of the substrate;
a gate insulating layer disposed on a surface of the buffer layer;

a first interlayer insulating layer disposed on a surface of the gate insulating;
a planarization layer disposed on a surface of the first interlayer insulating layer;
a common electrode layer disposed on a surface of the planarization layer, wherein a patterning process is performed on the common electrode layer to form a number of common electrode plates distributed in an array; wherein horizontal gaps and vertical gaps are formed between the common electrode plates, wherein the horizontal gaps are shielded by the horizontal light shielding strips, and the vertical gaps are shielded by the vertical light shielding strips;
a second interlayer insulating layer disposed on a surface of the common electrode layer, wherein a plurality of first metal vias and a plurality of second metal vias are formed in the second interlayer insulating layer, and the second metal vias are formed and closely fit to edges of the common electrode plates;
a plurality of sensing electrode wires distributed on a surface of the second interlayer insulating layer, wherein the sensing electrode wires are parallel to each other and are connected with the common electrode plates through the first metal vias; and
a plurality of sensing electrode sub-wires distributed on the surface of the second interlayer insulating layer and connected with the common electrode plates through the second metal vias, wherein the sensing electrode sub-wires and the sensing electrode wires are parallel to each other, and one of the sensing electrode sub-wires is located between one of the vertical light shielding strips and one of the vertical gaps.

2. The in-cell touch screen according to claim 1, wherein a passivation layer is disposed on a surface of the second interlayer insulating layer, a number of pixel electrodes distributed in an array are disposed on a surface of the passivation layer, and the sensing electrode sub-wires together with the pixel electrodes form an electric field configured to drive liquid crystal molecules to tilt.

3. The in-cell touch screen according to claim 1, wherein one of the sensing electrode sub-wires is correspondingly disposed in one of the vertical gaps between the common electrode plates in two neighboring columns, and the sensing electrode sub-wire is connected with one of the common electrode plates in the two neighboring columns.

4. The in-cell touch screen according to claim 1, wherein one of the vertical gaps between the common electrode plates in two neighboring columns corresponds to the plurality of sensing electrode sub-wires distributed vertically and spaced apart from each other, an interval distance between the sensing electrode sub-wires is identical to a width of one of the horizontal gaps, and one of the sensing electrode sub-wires is connected with one of the common electrode plates located on a side of the sensing electrode sub-wire.

5. The in-cell touch screen according to claim 4, wherein each of the second metal vias has an aperture less than an aperture of each of the first metal vias.

6. An in-cell touch screen, comprising:
a color filter substrate comprising a color resist layer and a black matrix, wherein the black matrix comprises a plurality of horizontal light shielding strips configured to shield scan lines and a plurality of vertical light shielding strips configured to shield data lines; and
an array substrate disposed and facing the color filter substrate, wherein the array substrate comprises:
a substrate;
a buffer layer disposed on a surface of the substrate;
a gate insulating layer disposed on a surface of the buffer layer;
a first interlayer insulating layer disposed on a surface of the gate insulating layer;
a planarization layer disposed on a surface of the first interlayer insulating layer;
a common electrode layer disposed on a surface of the planarization layer, wherein a patterning process is performed on the common electrode layer to form a number of common electrode plates distributed in an array; wherein horizontal gaps and vertical gaps are formed between the common electrode plates, wherein the horizontal gaps are shielded by the horizontal light shielding strips, and the vertical gaps are shielded by the vertical light shielding strips;
a second interlayer insulating layer disposed on a surface of the common electrode layer, wherein a plurality of first metal vias and a plurality of second metal vias are formed in the second interlayer insulating layer;
a plurality of sensing electrode wires distributed on a surface of the second interlayer insulating layer, wherein the sensing electrode wires are parallel to each other and are connected with the common electrode plates through the first metal vias; and
a plurality of sensing electrode sub-wires distributed on the surface of the second interlayer insulating layer and connected with the common electrode plates through the second metal vias, wherein the sensing electrode sub-wires and the sensing electrode wires are parallel to each other, and one of the sensing electrode sub-wires is located between one of the vertical light shielding strips and one of the vertical gaps.

7. The in-cell touch screen according to claim 6, wherein a passivation layer is disposed on a surface of the second interlayer insulating layer, a number of pixel electrodes distributed in an array are disposed on a surface of the passivation layer, and the sensing electrode sub-wires together with the pixel electrodes form an electric field configured to drive liquid crystal molecules to tilt.

8. The in-cell touch screen according to claim 6, wherein one of the sensing electrode sub-wires is correspondingly disposed in one of the vertical gaps between the common electrode plates in two neighboring columns, and the sensing electrode sub-wire is connected with one of the common electrode plates in the two neighboring columns.

9. The in-cell touch screen according to claim 6, wherein one of the vertical gaps between the common electrode plates in two neighboring columns corresponds to the plurality of sensing electrode sub-wires distributed vertically and spaced apart from each other, an interval distance between the sensing electrode sub-wires is identical to a width of one of the horizontal gaps, and one of the sensing electrode sub-wires is connected with one of the common electrode plates located on a side of the sensing electrode sub-wire.

10. The in-cell touch screen according to claim 9, wherein each of the second metal vias has an aperture less than an aperture of each of the first metal vias.

11. An in-cell touch screen, comprising:
a color filter substrate comprising a color resist layer and a black matrix, wherein the black matrix comprises a plurality of horizontal light shielding strips configured to shield scan lines and a plurality of vertical light shielding strips configured to shield data lines; and an array substrate disposed and facing the color filter substrate, wherein the array substrate comprises:
a substrate;
a buffer layer disposed on a surface of the substrate;
a gate insulating layer disposed on a surface of the buffer layer;
a first interlayer insulating layer disposed on a surface of the gate insulating;
a planarization layer disposed on a surface of the first interlayer insulating layer;
a common electrode layer disposed on a surface of the planarization layer, wherein a patterning process is performed on the common electrode layer to form a number of common electrode plates distributed in an array; wherein horizontal gaps and vertical gaps are formed between the common electrode plates, wherein the horizontal gaps are shielded by the horizontal light shielding strips, and the vertical gaps are shielded by the vertical light shielding strips;
a second interlayer insulating layer disposed on a surface of the common electrode layer, wherein a plurality of first metal vias are formed in the second interlayer insulating layer;
a plurality of sensing electrode wires distributed on a surface of the second interlayer insulating layer, wherein the sensing electrode wires are parallel to each other and are connected with the common electrode plates through the first metal vias;
a passivation layer disposed on the surface of the second interlayer insulating layer, wherein a number of second metal vias pass through the passivation layer and the second interlayer insulating layer;
a transparent electrode layer disposed on a surface of the passivation layer, wherein a patterning process is performed on the transparent electrode layer to form a number of pixel electrodes in an array, and a gap is between the pixel electrodes; and
a plurality of pixel sub-electrodes distributed on the surface of the passivation layer and connected with the common electrode plates through the second metal vias, wherein one of the pixel sub-electrodes is located between one of the vertical light shielding strips and one of the vertical gaps.

12. The in-cell touch screen according to claim 11, wherein one of the pixel sub-electrodes is located between the pixel electrodes, and the one of the pixel sub-electrodes together with the pixel electrodes located at two sides of one of the pixel sub-electrodes form an electric field configured to drive liquid crystal molecules to tilt.

13. The in-cell touch screen according to claim 11, wherein one of the pixel sub-electrodes in a column is correspondingly disposed in one of the vertical gaps between the common electrode plates in two neighboring columns, and one of the pixel sub-electrodes is connected with one of the common electrode plates in the two neighboring columns.

14. The in-cell touch screen according to claim 11, wherein, in the pixel sub-electrodes located in a same column, an interval distance between the pixel sub-electrodes is identical to a width of one of the horizontal gaps.

15. The in-cell touch screen according to claim 14, wherein each of the second metal vias has an aperture less than an aperture of each of the first metal vias.

* * * * *